METHOD OF MAKING A SEMICONDUCTOR DEVICE

Filed Sept. 26, 1967 2 Sheets-Sheet 1

INVENTOR
JOSEPH W. ADAMIC, JR.
Harold E. Meier
ATTORNEY

METHOD OF MAKING A SEMICONDUCTOR DEVICE

Filed Sept. 26, 1967 2 Sheets-Sheet 2

United States Patent Office 3,528,168

Patented Sept. 15, 1970

3,528,168

METHOD OF MAKING A SEMICONDUCTOR DEVICE

Joseph W. Adamic, Jr., Dallas, Tex., assignor to Texas Instruments Incorporated, Dallas, Tex., a corporation of Delaware Filed Sept. 26, 1967, Ser. No. 670,635

Int. Cl. H01l *11/14*

U.S. Cl. 29—571 5 Claims

ABSTRACT OF THE DISCLOSURE

A semiconductor device wherein the process of fabrication includes forming a layer of impurities into a semiconductor substrate in a predetermined pattern through a diffusion mask. A thick dielectric is deposited over the entire surface of the semiconductor substrate including the diffused area and the diffusion mask. A section of the dielectric is removed exposing a portion of the doped impurity region which is then etched away to define separate and distinct doped regions. Next, a thin insulating layer is grown or deposited on the semiconductor substrate in the etched region between the two doped regions and openings formed in the thick dielectric to expose the doped regions to a metal layer deposited directly onto the dielectric and extending over the insulating layer. Electrical contacts are formed by selective removal of the metal layer; the metal gate covering the insulating layer extends over the thick dielectric but is electrically isolated from the doped regions by the thick dielectric.

This invention relates to a semiconductor device, and more particularly to a semiconductor device fabricated by a process resulting in improved electrical characteristics therefor.

Parasitic capacitance in discrete and integrated insulated gate field effect transistors (IGFET) primarily results from the gate overlapping the source and drain regions while separated by only a thin layer of dielectric material. Many processes presently employed in the fabrication of an IGFET include the step of aligining a mask pattern to form the metal gate on the thin dielectric layer between the source and drain regions. This alignment is critical since the metal gate must coincide with the source and drain regions if the device is to operate properly. Any misalignment will, however, result in either a faulty device or a device with a parasitic capacitance value even higher than normal for such devices.

A typical prior method of fabricating a semiconductor device commences by depositing an oxide layer on a semiconductor substrate to a thickness of about 10,000 angstrom units. Next, the oxide layer is removed in a predetermined area and another oxide layer approximately 2,000 angstrom units thick grown onto the surface of the semiconductor substrate. This 2,000 angstrom unit layer of oxide is then removed in given areas to define separate and distinct regions into which an impurity is diffused. After the impurity has been diffused to the desired depth, a 2,000 angstrom unit layer of the oxide is removed and a final oxide layer deposited or grown over the entire semiconductor substrate including the impurity doped regions. This last oxide layer is removed in small areas to expose the impurity doped regions to a layer of metal deposited over the entire surface of the device. Finally, the metal layer is selectively removed to define contacts to the source and drain regions. In addition to the contacts to the source and drain regions, a metal gate is defined between the source and drain regions and must extend over each due to available process limitations. If the metal layer pattern is not in correct alignment, the metal gate would not be properly positioned resulting in either a faulty device or one with a higher parasitic capacitance.

Thus, an important feature of the present invention is to provide a fabrication process wherein the parasitic capacitance associated with insulated gate field effect transistors is minimized by limiting the gate metal overlap of the source and drain regions to an amount which is less than or equal to the junction depth.

Another feature of the present invention is to provide a method of fabricating a semiconductor device wherein the impurity concentration in the semiconductor substrate in the area beneath the gate is controlled to vary the threshold voltage of the device.

The resulting semiconductor device comprises a body of a semiconductor substrate containing source and drain regions separated by an area covered with an insulating layer, the entire substrate including the source and drain regions but excluding the insulating layer are covered with a thick dielectric; passages are cut in the dielectric to permit metal contacts to the source and drain regions. A metal gate also covers the insulating layer and extends over the thick dielectric but is separated from the source and drain regions by a distance which is equal to the thickness of the dielectric layer.

The method of fabricating the semiconductor device includes the deposition of an insulating layer over a portion of a semiconducting substrate between source and drain regions defined by a dielectric layer covering these regions and the substrate; contacts are formed through the dielectric layer, one of which extends to the source and another of which extends to the drain; and a metal gate is also formed over the insulating layer which extends over the dielectric layer but is isolated from the source and drain regions by said layer.

A more complete understanding of the invention and its advantages will be apparent from the specification and claims and from the accompanying drawings illustrative of the invention.

Referring to the drawings.

Figure 1:
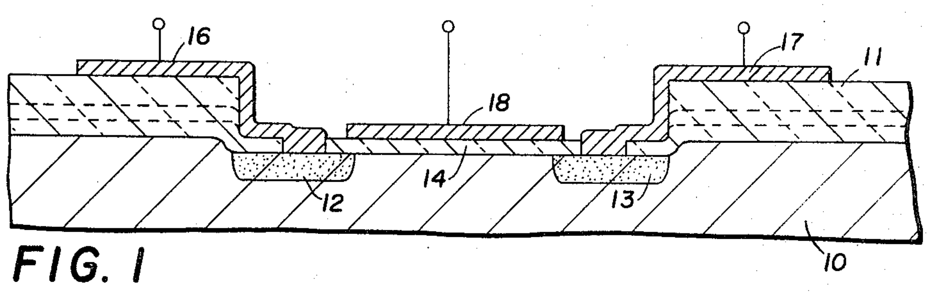
FIGS. 1 and 2 are somewhat sectional views greatly exaggerated which illustrate the somewhat critical alignment required in prior methods of fabricating a semiconductor device.

Referring to FIG. 1, an n-type silicon semiconductor substrate 10 is shown covered with a relatively thick layer of oxide 11 formed as the result of several oxide layer growing steps. The source and drain regions 12 and 13 are formed in the substrate 10 by doping the substrate with a p-type impurity, such as boron. These regions 12 and 13 are partially covered by a thin oxide layer 14 formed during the last oxide growing step. The device illustrated is an insulated gate field effect transistor and includes a source contact 16, a drain contact 17, and a metal gate 18. As explained previously, these contacts are formed by selectively removing a layer of metal deposited over the entire surface of the device. As shown in FIG. 1, the pattern has been properly aligned and the metal gate 18 extends an equal amount over the source 12 and the drain 13. Such extension is necessary for the operation of an IGFET; however, since the metal gate 18 is separated from the regions 12 and 13 by only the thin layer, approximately 1,000 angstrom units thick, of oxide 14, a transistor of this type will have higher parasitic capacitance than one in which the gate metal coincides with the source and drain regions.

Figure 2:
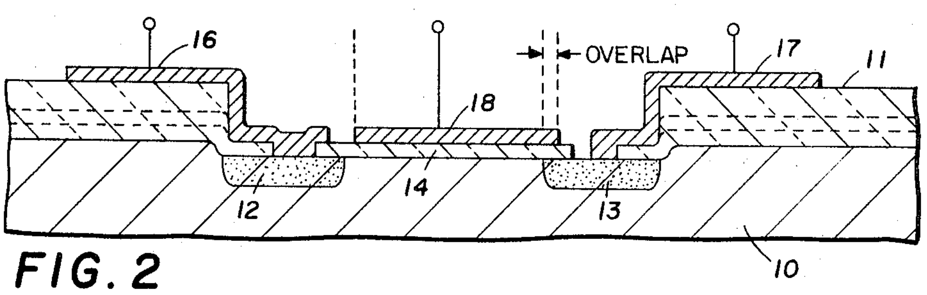
Figure 3:
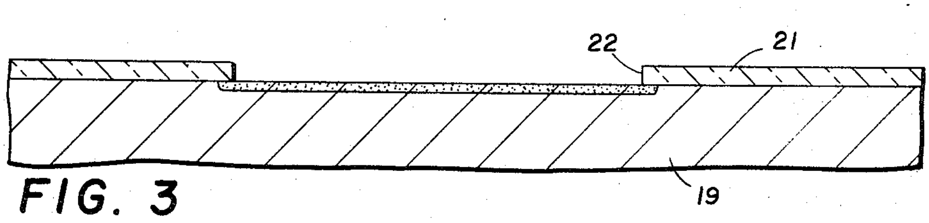
FIGS. 3–7 are somewhat schematic sectional views greatly exaggerated which serve to illustrate the steps of the process of one embodiment of the present invention.
Figure 4:
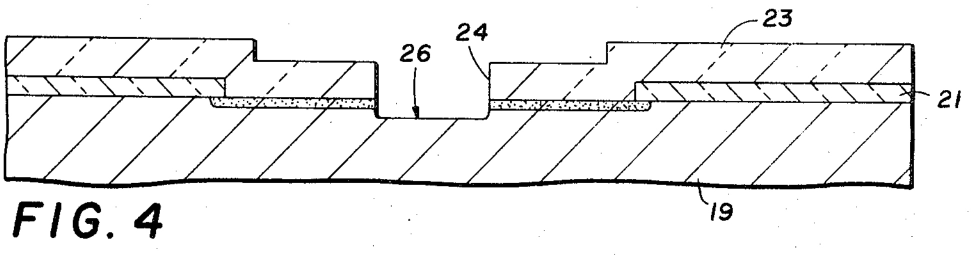
Figure 5:
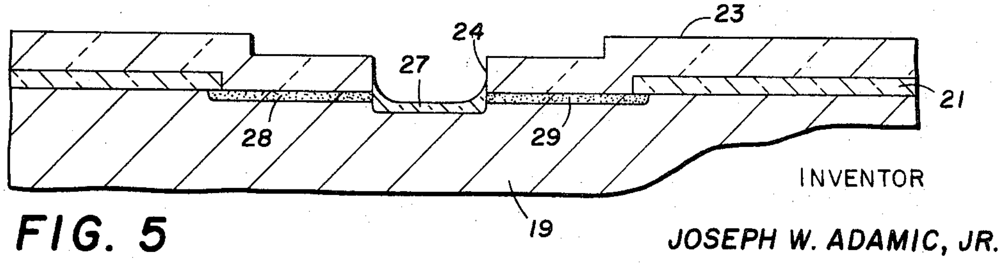
Figure 6:
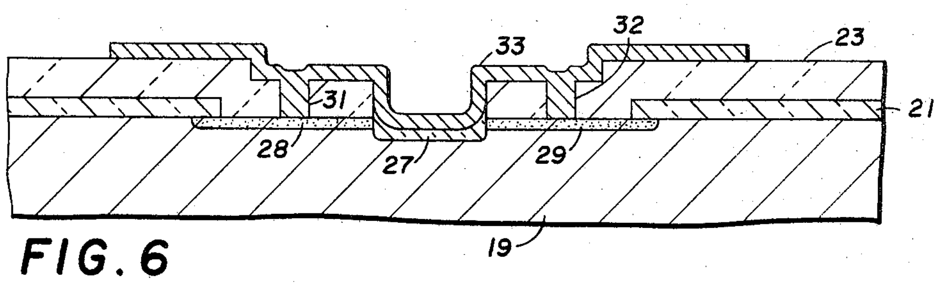
Figure 7:
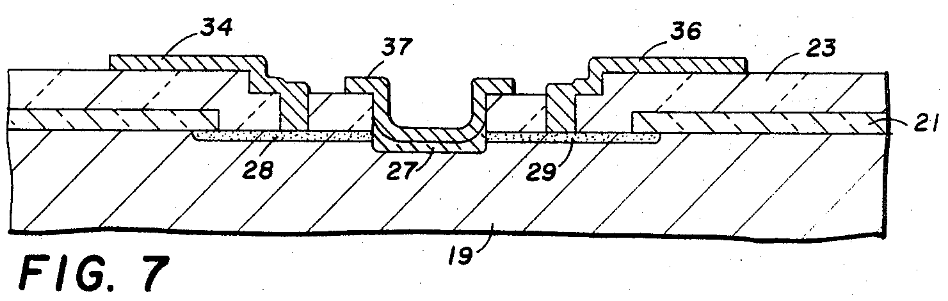

Referring to FIG. 2, there is shown a semiconductor device wherein the gate 18 has been misaligned; this misalignment is the result of improperly positioning the pattern when forming the source contact 16, the drain contact 17, and the gate 18. It should be emphasized that FIG. 2 is greatly exaggerated and that the alignment is critical within 0.2 mil, not the fractions of an inch as shown. A gate 18 misaligned by the amount shown not only results in a transistor with poor electrical properties, but also a transistor with excessive parastic capacitance. The excessive parasitic capacitance is caused by the excessive overlap of the gate 18 over the drain 13 and the poor transistor characteristics are the result of the gate metal 18 missing the source 12 entirely. Since the gate 18 must coincide with the source for the device to properly operate as a transistor, the condition shown is the worst possible case.

Referring now to FIGS. 3–7, the starting material for the process of the present invention is a single resistivity semiconductor substrate 19. For example, the substrate 19 may be n-type silicon having a resistivity on the order of about 1 to 3 ohm-centimeters. p-Type silicon may also be used as the semiconducting substrate.

Next, a diffusion mask is formed on the surface of the substrate 19 by depositing or growing and selectively removing a silicon dioxide or silicon nitride layer 21 using photo-resist and a buffered solution in the conventional manner. The mask has an opening 22 which can be seen in the plan view of FIG. 3. The photo-resist is removed from the layer 21 using a conventional stripper solution before the diffusion step presently to be described.

Using an n-type silicon semiconductor substrate, a p-type impurity, such as boron, is deposited through the opening 22 into the exposed portion of the semiconductor substrate 19. For a p-type silicon substrate, typical materials for depositing are phosphorus, antimony and arsenic. The deposition process is carried out by placing the substrate 19 in a standard furnace maintained at a temperature which is selected to provide the desired concentration of doping impurities at the substrate surface. A temperature in the range of about 900° C. to about 1200° C. is usually suitable, although a relatively low deposition temperature of between about 950° C. and about 1000° C. is preferable. For an n-type silicon substrate, a suitable p-type doping material is now passed through the deposition furnace by a suitable carrier gas. Although other p-type doping materials may be used, a preferred doping material is boron which may be derived from a boron halide, such as boron tribromide. The carrier gas may be a mixture of nitrogen and oxygen. As the result of passing the gaseous mixture of nitrogen, oxygen, and boron tribromide over the surface of the heated substrate, a very thin layer of boron oxide, primarily $B_2O_3$, is formed on the surface of the substrate 19 exposed through the opening 22 of the diffusion mask 21. The boron in the atmosphere of the furnace together with this thin layer of boron oxide functions essentially as an unlimited source of boron from which a very shallow diffused region having a very high concentration of boron is formed. Because of the unlimited source, the concentration at the surface will be determined by the solubility of the boron in the silicon at the selected temperature; the distribution of boron with depth will be definable by a complementary error function. The duration of the boron deposition is relatively short, on the order of thirty to forty-five minutes. If a deeper junction in the area of the opening 22 is desired, the dopant is diffused into the substrate at a higher temperature or for a longer time.

After the oxides from the diffusion step have been stripped from the surface of the substrate 19, by diluted hydrofluoric acid, for example, a thick dielectric layer 23 is formed over the surface of the substrate by a suitable process. For example, the entire surface of the semiconductor substrate 19 is coated with silicon dioxide ($SiO_2$) using any suitable conventional process, such as the thermal decomposition of tetraethyl orthosilane (TEOS). The silicon dioxide layer 23 is typically about 10,000 angstrom units thick or greater. An opening 24 having a configuration defining the gate region is then cut into the dielectric layer using conventional photoresist techniques to expose a portion of the impurity doped layer.

The substrate 19 is now subjected to an etching process for selectively attacking the area exposed through the opening 24. A vapor etch technique may be used for this purpose. The surfaces are exposed to a 5% hydrochloric gas in hydrogen at 1250°–1300° C. for the time necessary to obtain a specified depth. As a result, a pocket 26 is formed in the substrate 19 which is typically about 0.0001 inch deep and somewhat wider than the opening 24 which is determined by the desired characteristics of the semiconductor device.

At this point, a doping impurity may be diffused into the substrate in the pocket 26 to control the threshold voltage of the device. It is known that by controlling the impurity concentration in the semiconductor beneath the gate contact of an IGFET, the threshold voltage can be controlled. Again, for an n-type substrate 19, a p-type dopant is diffused in a manner substantially the same as the previous diffusion, except that the depth of diffusion of the impurity in the gate region will be much less. An alternative method of controlling the threshold voltage is to control the etching step to remove all but a thin layer of the first diffusion in the area of the pocket 26. This, in effect, provides the same substrate preparation as the second diffusion step.

Following either the etching step or the gate region diffusion, a gate insulator 27 is grown or deposited on the substrate 19 in the pocket 26 between the source region 28 and the drain region 29. The gate insulator can be a sandwich of silicon oxide and silicon nitride. Alternatively, gate insulator 27 may be a dielectric layer formed in a manner similar to the thick dielectric layer 23 by a suitable low temperature process. For example, an oxide may be formed over the surface of the substrate 19 using a standard furnace to heat the substrate to a temperature in the range of about 400° C. to about 500° C. Then a mixture of tetraethyl orthosilane and oxygen is passed through the furnace for a period of time necessary to form a dielectric layer of the desired thickness.

Openings 31 ond 32 are now cut through the dielectric layer 23 to the shallow, high concentration regions 28 and 29, and a suitable metallic film 33, about 5,000 angstrom units thick, deposited by evaporation or other suitable technique over the entire surface. The metallic film is then selectively removed to form a first contact 34 extending through the opening 31 to the source region 28, and a second contact 36 extending through the opening 32 to the drain region 29. Simultaneously, the gate metal 37 is defined to cover the insulator gate 27 and extend over the thick dielectric layer 23 in the areas of the source region 28 and the drain region 29. However, the metal gate 37 is separated from the source and drain regions by the thick dielectric 23, thereby minimizing the parasitic capacitance of the device.

Instead of using a diffusion process to introduce the impurities into the semiconducting substrate 19 for the source region 28 and the drain region 29, an epitaxial process could be used. Either the method of "etching and back filling" or simply forming an epitaxial layer over the entire surface are two possible ways of carrying out epitaxial crystal growth. In the "etch and back fill" method, pockets are etched into the substrate 19 for the source and drain regions by a process similar to that described previously for etching the pocket 27. A single crystal semiconductor body, for example, a silicon, is then epitaxially grown in each of the pockets to form the source region 28 and the drain region 29. Alternatively, an epitaxial layer is grown over the entire area of the substrate 19 and a thick dielectric deposited and selectively removed as previously described. The layer is then removed by etching the desired areas in a manner similar to that described previously.

Figure 8:
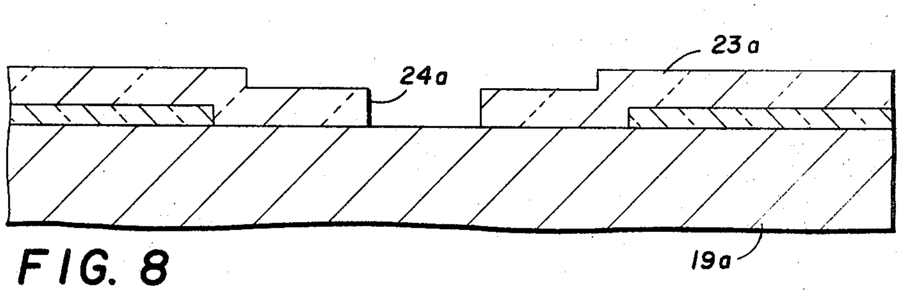
FIGS. 8–10 are also somewhat schematic sectional views greatly exaggerated which serve to illustrate the steps of a process of an alternate embodiment of the present invention.
Figure 9:
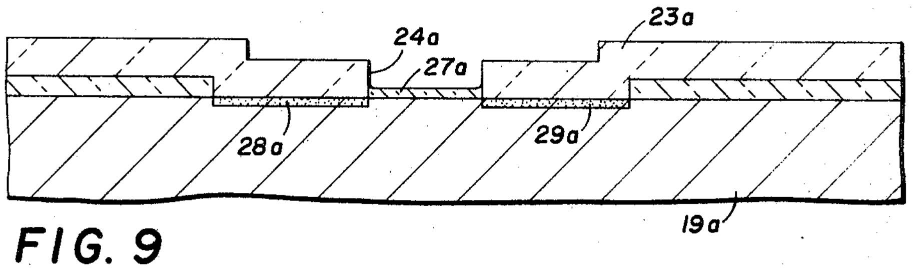
Figure 10:
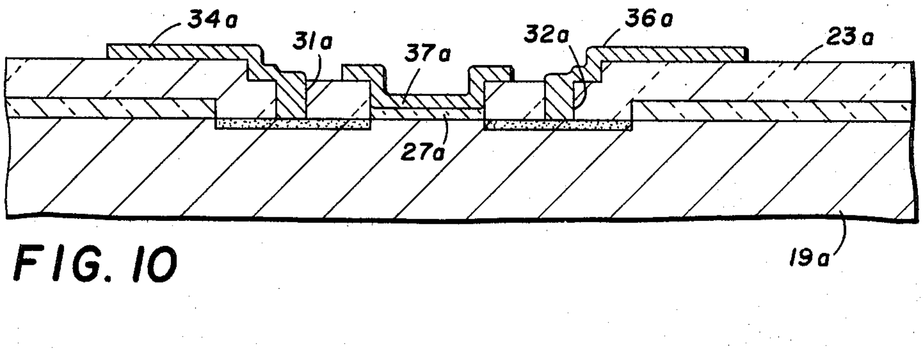

An alternative embodiment of this invention is shown in FIGS. 8–10, wherein corresponding parts are designated by the same reference numerals followed by the reference character *a*. First, a diffusion mask is formed on the surface of the substrate 19*a* as we described with reference to FIG. 3 by depositing and selectively removed. Next, a thick layer, in excess of 5,000 angstrom units, of a doped dielectric (i.e., doped $SiO_2$) is deposited over the entire surface of the substrate 19*a* by a process similar to the low temperature method described with reference to FIG. 4. An opening 24*a*, having a configuration defining the gate region, is then cut in the layer 23*c* using conventional patterning techniques to expose a portion of the substrate 19*a*.

Next, a gate dielectric 27*a* is grown or deposited in the area defined by the opening 24*a* by a technique which will diffuse the impurity from the doped oxide layer 23*a* into the substrate 19*a* forming a source region 28*a* and a drain region 29*a*. The standard diffusion furnace may be used for this step and heated to a temperature in a range from about 900° C. to about 1300° C. However, a doping material is not passed through the furnace at this time as the impurities will be supplied from the dielectric layer 23*a*. The final step in this alternate method is substantially the same as the final step in the previous method. Openings 31*a* and 32*a* are cut in the oxide layer 23*a* to expose the source region 28*a* and the drain region 29*a* to a suitable metal film deposited and selectively removed to form the source contact 34*a*, the drain contact 36*a*, and the gate 37*a*. Again, this process minimizes parasitic capacitance resulting from the gate 37*a* separated from the regions 28*a* and 29*a* by a thick dielectric.

Although the process is particularly useful in the fabrication of discrete and integrated insulated gate field effect transistors and similar devices, it will be appreciated by those skilled in the art that the process is also useful in the fabrication of other semiconductor devices such as integrated circuit resistors. Thus, while only preferred embodiments of the invention, together with modifications thereof, have been described in detail herein and shown in the accompanying drawings, it will be evident that various further modifications are possible without departing from the scope of the invention.

What is claimed is:

1. A method of fabricating a semiconductor device which comprises:
   - forming a semiconductor region of one conductivity type in a semiconductor substrate of opposite conductivity type,
   - depositing a thick dielectric layer on said substrate covering said region of one conductivity type,
   - selectively removing a portion of said dielectric layer to expose a portion of said substrate including an intermediate segment of the region of one conductivity type,
   - selectively removing semiconductor material from said exposed portion of the substrate to a depth sufficient to divide said region of one conductivity type into separate source and drain regions, and thereby expose portion of the underlying region of said opposite conductivity type,
   - diffusing an impurity into the exposed region of said semiconductor substrate to control the threshold voltage of the completed device,
   - forming a thin insulating layer over said exposed portion of opposite conductivity type and over the exposed edges of the source and drain regions respectively,
   - forming ohmic contacts on the surface of the dielectric layer and the insulating film, one of said contacts extending to the source region and another of said contacts extending to the drain region, and
   - forming a gate electrode covering said thin insulating film.

2. A method of fabricating a semiconductor device as defined by claim 1 wherein said source and drain contacts and the gate electrode are formed by:
   - opening contact windows in said dielectric layer to expose a portion of said source region and a portion of said drain region, respectively,
   - depositing a layer of metal over the dielectric layer and the insulating film, and selectively removing said metal layer to form separate ohmic contacts to the source and drain regions, respectively, and a separate gate electrode covering said insulating film.

3. A method of fabricating a semiconductor device as defined by claim 1 wherein said region of one conductivity type is formed by the diffusion of a conductivity type determining impurity into a surface of semiconductor substrate.

4. A method of fabricating a semiconductor device as defined by claim 1 wherein said semiconductor substrate is n-type silicon and the source and drain regions contain boron as a dopant.

5. A method of fabricating a semiconductor device as defined by claim 1 wherein said semiconductor substrate is p-type silicon and said source on drain regions are doped with an impurity from the group consisting of phosphorus, antimony and arsenic.

References Cited

UNITED STATES PATENTS

| | | | |
|---|---|---|---|
| 3,233,186 | 2/1966 | Theriault | 317—235 |
| 3,246,173 | 4/1966 | Silver | 317—235 |
| 3,305,708 | 2/1967 | Ditrick | 317—235 |
| 3,349,474 | 10/1967 | Rauscher | 317—235 |
| 3,374,407 | 3/1968 | Olmstead | 317—235 |

FOREIGN PATENTS 1,045,429 10/1966 Great Britain.

OTHER REFERENCES

IBM Tech Discl. Bull.: "Fabrication of Monolithic Integrated Circuit Structure by a Semiconductor Etching Technique," by Ames et al., vol. 9, No. 1, June 1966, pages 110–111.

PAUL M. COHEN, Primary Examiner

U.S. Cl. X.R.

317—235, 21.1; 307—304